United States Patent
Connell et al.

(10) Patent No.: US 6,750,704 B1
(45) Date of Patent: Jun. 15, 2004

(54) OFFSET COMPENSATED DIFFERENTIAL AMPLIFIER

(75) Inventors: Lawrence Edwin Connell, Naperville, IL (US); Craig S. Petrie, Provo, UT (US); Matthew R. Miller, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/340,335

(22) Filed: Jan. 9, 2003

(51) Int. Cl.[7] ................................. H03F 1/02
(52) U.S. Cl. ..................... 330/9; 330/51; 330/253; 330/258
(58) Field of Search .................. 330/9, 51, 253, 330/258

(56) References Cited

U.S. PATENT DOCUMENTS

| 4,628,274 A | 12/1986 | Vittoz et al. |
| 4,710,724 A | 12/1987 | Connell et al. |
| 5,017,805 A | 5/1991 | Kase |
| 5,311,085 A | 5/1994 | Pelgrom et al. |
| 5,565,813 A | 10/1996 | Connell et al. |
| 6,046,638 A * | 4/2000 | Hogeboom ............ 330/252 |

FOREIGN PATENT DOCUMENTS

JP 5175744 * 7/1993

OTHER PUBLICATIONS

Baghai et al. "A New Offset Cancellation Technique for CMOS Differential Amplifiers" IEEE Journal of Electronics 1995 pp 2229–2232.*

Tanchy Shih, Lawrence Der, Stephen H. Lewis, and Paul J. Hurst, "A Fully Differential Comparator Using a Switched–Capacitor Differencing Circuit with Common–Mode Rejection", IEEE Journal of Solid–State Circuits, Feb. 1997, pp. 250–253, vol. 32, No. 2.

* cited by examiner

*Primary Examiner*—Michael B Shingleton
(74) *Attorney, Agent, or Firm*—Ingrassia Fisher & Lorenz, P.C.

(57) ABSTRACT

A differential amplifier comprises a differential input stage including first and second input devices and has first and second input electrodes and first and second output terminals. A differential load stage includes first and second load devices having first and second control electrodes respectively. The load stage is coupled to the differential input stage and to the first and second output terminals. First and second separate capacitive biasing networks are coupled to the first and second output terminals and respectively to the first and second control electrodes. During an offset-cancellation phase, the input electrodes are coupled to a common voltage. During an amplification phase, a differential input signal is applied to the input electrodes.

32 Claims, 2 Drawing Sheets

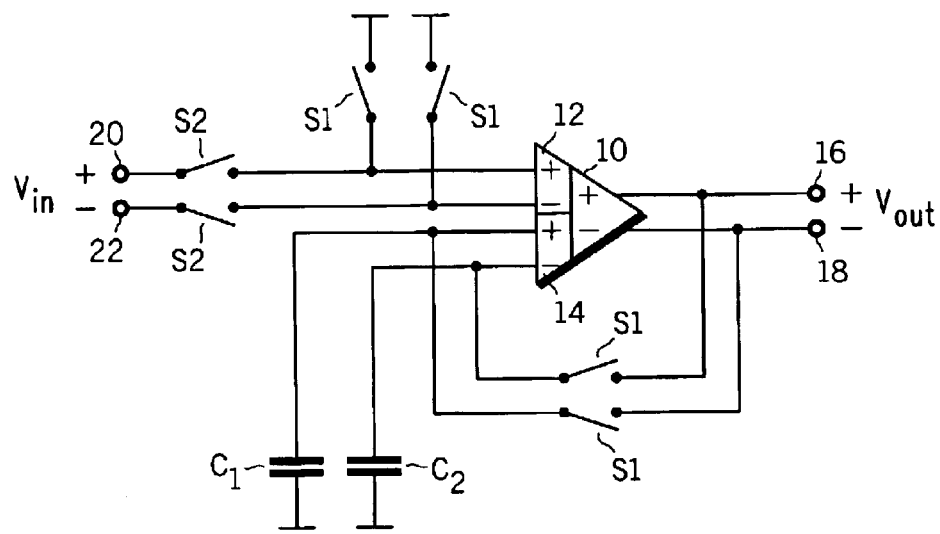
FIG. 1
-PRIOR ART-
FIG. 2
-PRIOR ART-
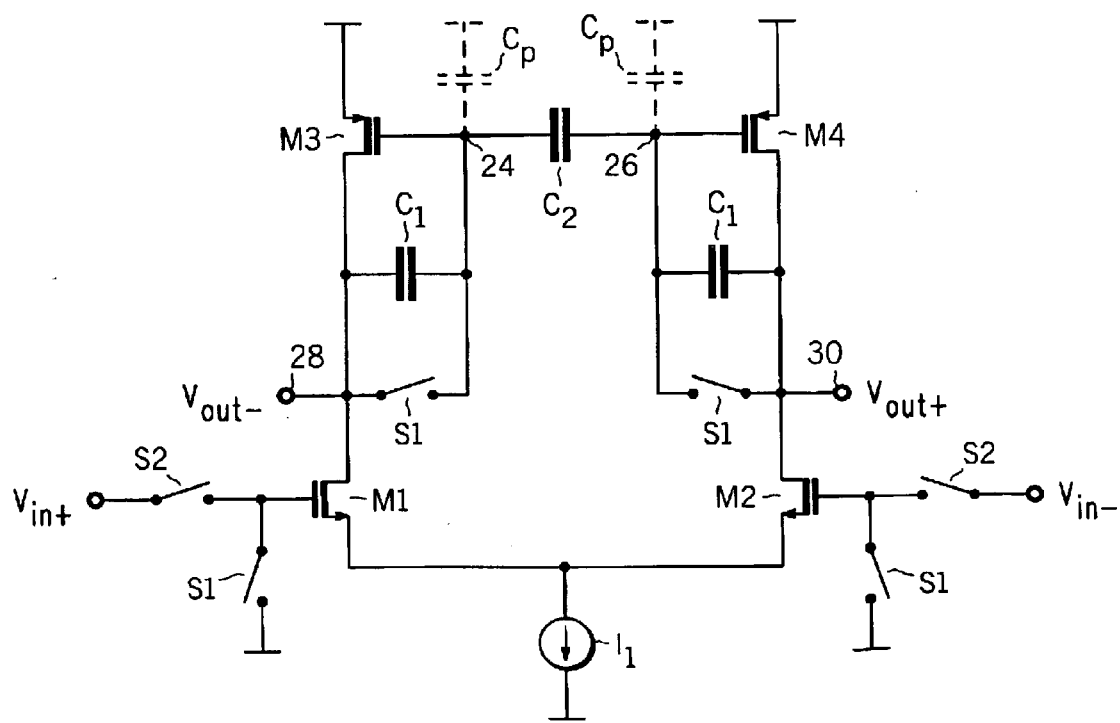

OFFSET COMPENSATED DIFFERENTIAL AMPLIFIER

TECHNICAL FIELD

This invention relates generally to comparator circuits and, more particularly, to a stable, high-speed, high-gain, differential amplifier suitable for use as a comparator preamplifier and utilizing separately driven load devices for offset-voltage compensation.

BACKGROUND OF THE INVENTION

As modern communication receiver functions migrate further into the more cost-effective digital domain, there is an increasing need for wide-bandwidth analog-to-digital converters (ADCs). One promising ADC architecture, known as a multi-bit sigma-delta modulator, typically utilizes an internal flash ADC incorporating a large array of comparators and preamplifiers. The performance of the multi-bit sigma-delta ADC can be significantly impacted by the design characteristics (e.g. offset-voltage, gain, common-mode stability, input capacitance) of the flash preamplifiers.

For example, variations in the integrated circuit fabrication process can cause mismatches in the input devices which process the amplifier's input signals. This results in an offset-voltage which is generally defined as the input voltage required to drive the preamplifier's output voltage to zero. Offset-voltages in the preamplifiers of a flash ADC will result in a nonlinear ADC transfer function. When used in a high-bandwidth multi-bit sigma-delta modulator, this non-linear transfer function will cause distortion in the overall ADC and thus reduce its resolution.

In a comparator, the preamplifier is typically followed by a clocked latch that samples the preamplifier's output signal and produces a full logic-level output. CMOS latches for example, often have large offset-voltages relative to the preamplifier, the impact of which is reduced if the gain of the preamplifier is high. Thus, a large preamplifier gain is desirable.

The comparator latch should be designed utilizing fully differential circuitry for noise rejection and low offset-voltage. This requires a fully differential preamplifier utilizing common-mode feedback to maintain the preamplifier's outputs at a stable voltage between the power supply voltages. Ideally, the common-mode feedback circuitry should not degrade the gain or offset performance of the preamplifier.

Finally, the number of preamplifier's utilized in a flash ADC increases with resolution. The preamplifier array is typically driven by an on-chip operational amplifier. Thus, the preamplifier should have a low input capacitance in order to minimize power dissipation in the operational amplifier.

One known offset-cancellation technique characterized by high preamplifier gain and low input capacitance utilizes a dual differential amplifier wherein the output is simply the sum of amplified versions of two differential input signals. This dual differential amplifier operates in two phases, an offset-cancellation phase and an amplification phase. During the offset-cancellation phase, the input terminals are coupled together or to a common voltage, and feedback is applied to auxiliary input terminals. The voltage that is required to force a zero output voltage is stored on capacitors coupled to the auxiliary input terminals. This stored voltage reduces offset-voltage during a subsequent amplification phase when the input terminals are coupled to receive a differential input signal. Unfortunately, such designs typically utilize a differential pair to realize the auxiliary input thus resulting in more current drain in the preamplifier. For more information, the interested reader is referred to U.S. Pat. No. 4,628,274 issued Dec. 9, 1986 and entitled "Amplifier with Input Drift Voltage Compensation" and U.S. Pat. No. 5,311,085 issued May 10, 1994 and entitled "Clocked Comparator with Offset-Voltage Compensation".

Another technique utilizes the amplifier's load devices as the auxiliary inputs thus saving power. Examples of such arrangements are shown in U.S. Pat. No. 5,017,805 issued May 21, 1991 and entitled "Offset Cancel Latching Comparator", U.S. Pat. No. 5,565,813 issued Oct. 15, 1996 and entitled "Apparatus for a Low Voltage Differential Amplifier Incorporating Switched Capacitors", and in "A Fully Differential Comparator Using a Switched-Capacitor Differencing Circuit with Common-Mode Rejection", IEEE Journal of Solid-State Circuits, Volume 32, No. 2, pages 250–253, Feb. 1997. Unfortunately, techniques utilizing this approach cannot achieve high gain without sacrificing common-mode stability and requiring large capacitor values.

It should be therefore appreciated that it would be desirable to provide an improved offset-compensated amplifier that is characterized by superior common-mode stability without a corresponding sacrifice in differential gain.

BRIEF DESCRIPTION OF THE DRAWINGS

The following drawings are illustrative of particular embodiments and therefore do not limit the scope of the invention, but are presented to assist in providing a proper understanding. The present invention will hereinafter be described in conjunction with the appended drawings, wherein like reference numerals denote like elements and;

FIG. 1 is a schematic diagram of a preamplifier utilizing auxiliary inputs for offset-voltage cancellation in accordance with the prior art;

FIG. 2 is a schematic diagram of a preamplifier circuit wherein the load devices are utilized as auxiliary inputs in accordance with the prior art;

DETAILED DESCRIPTION OF THE EXEMPLARY EMBODIMENT

Figure 3:
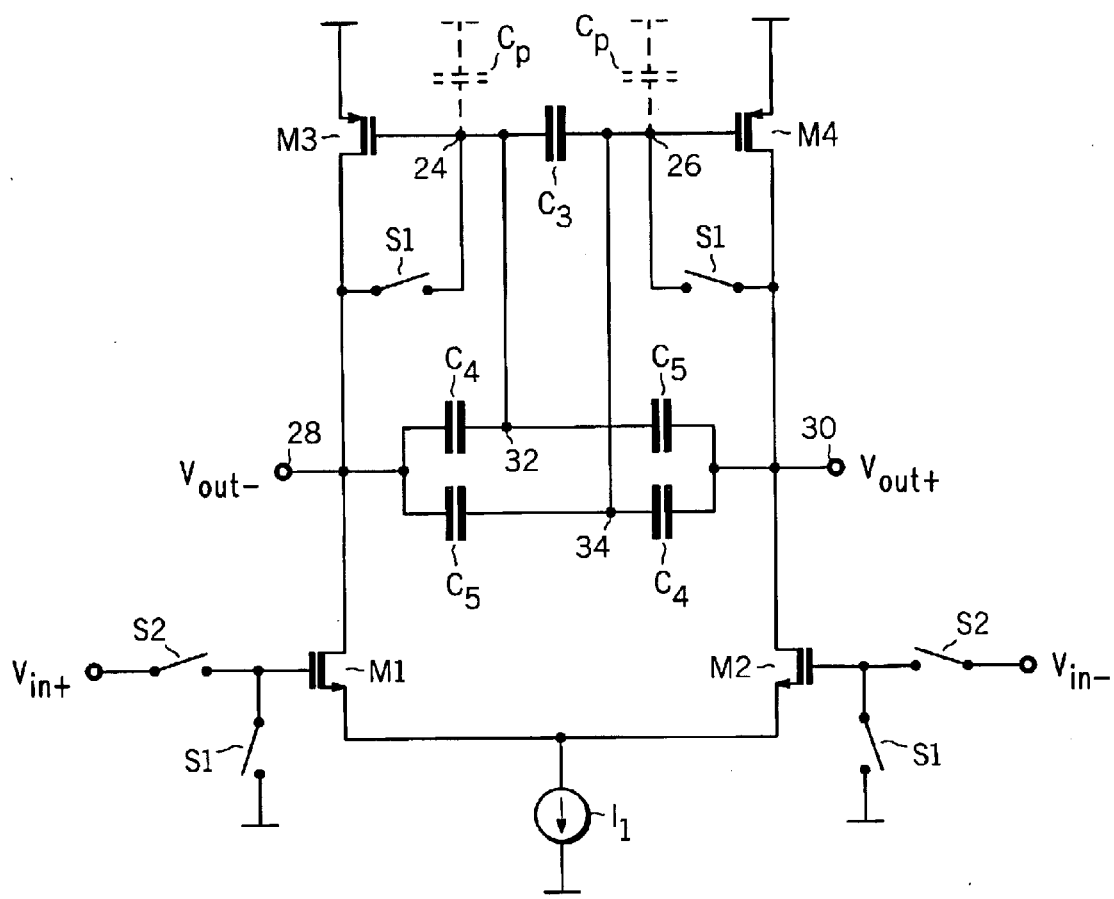
FIG. 3 is a schematic diagram of an offset-compensated, differential amplifier characterized by high gain and good common-mode stability in accordance with the teachings of the present invention.

The following description is exemplary in nature and is not intended to limit the scope, applicability, or configuration of the invention in anyway. Rather, the following description provides a convenient illustration for implementing an exemplary embodiment of the invention. Various changes to the described embodiment may be made in the function and arrangement of the elements described herein without departing from the scope of the invention.

FIG. 1 is a schematic diagram of a preamplifier utilizing an offset-cancellation technique and characterized by both high preamplifier gain and low input capacitance. The amplifier comprises a dual differential amplifier and summing circuit 10 including first and second differential amplifiers 12 and 14. The output ($V_{out}$) appearing across output terminals 16 and 18 represents the sum of amplified versions of two differential inputs. As can be seen, first and second inputs of differential amplifier 12 may be electrically coupled via switches S2 to input terminals 20 and 22 for receiving a differential input signal $V_{in}$. The first and second inputs of differential amplifier 12 may be coupled to a common voltage (e.g. ground) via switches S1.

First and second inputs of differential amplifier 14 are coupled to first terminals of capacitors C1 and C2, each of which has a second terminal coupled to a common voltage. In addition, the first and second input terminals of differential amplifier 14 are coupled respectively to output terminals 18 and 16 via feedback switches S1.

The preamplifier shown in FIG. 1 operates in two phases, an offset-cancellation phase and an amplification phase. During the offset-cancellation phase, switches S1 are closed and switches S2 are opened. Thus, feedback is applied to auxiliary input terminals (i.e. the input terminals of differential amplifier 14) while the normal input terminals 20 and 22 are shorted together or to a common voltage. The negative feedback paths and input shorting switches assure that the output voltage ($V_{out}$) appearing across terminals 16 and 18 remains small for zero input. The voltage that is required to force $V_{out}$ to zero is stored on capacitors $C_1$ and $C_2$.

During the amplification phase, switches S1 are opened, switches S2 are closed, and a differential input voltage $V_{in}$ appearing across terminals 20 and 22 is applied to the differential amplifier. The negative offset-voltage stored on capacitors $C_1$ and $C_2$ is applied to the first and second inputs of differential amplifier 14. The respective outputs of differential amplifiers 12 and 14 are summed as previously described resulting in a cancellation of the offset-voltage from output voltage $V_{out}$ appearing across terminals 16 and 18. As stated previously however, amplifier circuits employing this technique often utilize a differential pair to realize the auxiliary inputs thus increasing the current drain of the preamplifier.

FIG. 2 is a schematic diagram of an offset-compensated differential amplifier wherein load devices M3 and M4 are utilized as the auxiliary inputs in accordance with another known technique. As can be seen, the source electrodes of differential-input, MOS transistors M1 and M2 (e.g. n-channel field-effect-transistors) are coupled together and to a source of supply voltage (e.g. ground) via current source $I_1$. Output signals $V_{out-}$ and $V_{out+}$ are produced at output terminals 28 and 30 respectively which are in turn coupled to the drain electrodes of input transistors M1 and M2 respectively. Differential load MOS transistors M3 and M4 (e.g. p-channel field-effect-transistors) are configured to have their source electrodes coupled to a second source of supply voltage (e.g. approximately two volts), their gate electrodes coupled respectively to nodes 24 and 26, and their drain electrodes coupled respectively to the drain electrodes of differential input transistors M1 and M2 (i.e. output terminals 28 and 30 respectively). As is shown, a parasitic capacitance $C_p$ appears between node 24 and the second source of supply voltage. Similarly a parasitic capacitance $C_p$ appears between node 26 and the second source of supply voltage. Capacitors $C_1$ are coupled across the gate and drain electrodes of load devices M3 and M4, and a capacitor $C_2$ is coupled between nodes 24 and 26. Switches S1 are coupled between the gate and drain electrodes of load devices M3 and M4.

During the offset-cancellation phase, switches S1 are closed and switches S2 are opened. Thus, the gate electrodes of input transistors of M1 and M2 are shorted to a common voltage (e.g. ground). Capacitors $C_1$ have little, if any, impact on the operation of the circuit during this phase because their respective terminals are shorted through switches S1. In this phase, any difference in voltage appearing at output terminals 28 and 30 would represent an offset-voltage due to potential mismatches between differential input devices M1 and M2 and/or mismatches between differential load devices M3 and M4. This offset-voltage becomes stored, on capacitor $C_2$ and parasitic capacitors $C_p$. When switches S1 are opened and switches S2 closed (i.e. during the amplification phase), a differential input signal is applied to the gate electrodes of differential input devices M1 and M2. Since any offset-voltage is stored across capacitors $C_2$ and parasitic capacitors $C_p$ a slightly different voltage corresponding to the offset-voltage exists at the gate electrodes of load transistors M3 and M4. This biases load devices M3 and M4 in such a way as to subtract the offset-voltage from the input voltage thus canceling the offset-voltage of the amplifier.

The circuit shown in FIG. 2 cannot achieve high gain without sacrificing common-mode stability and requiring large capacitor values. The capacitive network comprised of capacitors $C_1$ and $C_2$ provides negative feedback around load devices M3 and M4 reducing the load impendence and thereby reducing gain. For high gain, $C_2$ must be much larger than $C_1$ thus requiring a larger silicon area Furthermore, if $C_2$ is much larger than $C_1$, the parasitic capacitors $C_p$ will be large compared to capacitors $C_1$. This reduces the common-mode feedback around the load devices M3 and M4 and results in decreased common-mode stability. The resulting lower common-mode stability means that noise variations in current source $I_1$ or charge injection from the switches will cause large variations in the output voltages $V_{out+}$ and $V_{out-}$ appearing at output terminals 30 and 28 respectively from their nominal values established during the offset-cancellation phase.

FIG. 3 is a schematic diagram of an offset-compensated differential amplifier which substantially avoids the tradeoffs associated with the circuit shown in FIG. 3 thus allowing for a large differential gain while maintaining common-mode stability and smaller capacitor ratios. Capacitors $C_1$ and $C_2$ in FIG. 3 have been replaced by capacitive biasing networks comprised of capacitors $C_3$, $C_4$ and $C_5$. That is, the series combination of capacitor $C_4$, and capacitor $C_5$ having an intervening node 32 is coupled in parallel with a second series combination of capacitor $C_4$ and $C_5$ having an intervening node 34. In the first series combination, capacitor $C_4$ is coupled directly to output terminal 28, capacitor $C_5$ is coupled directly to output terminal 30, and node 32 is coupled to node 24. In the second series combination of capacitors $C_4$ and $C_5$ (coupled in parallel with the first series combination of capacitors $C_4$ and $C_5$), capacitor $C_4$ is coupled to output terminal 30, capacitor $C_5$ is coupled to output terminal 28, and node 34 is coupled to node 26.

During the offset-cancellation phase, switches S1 are closed and switches S2 opened. In this manner, input terminals $V_{in+}$ and $V_{in-}$ are coupled to a common voltage, and negative feedback exists around load devices M3 and M4. During the amplification phase, inputs $V_{in+}$ and $V_{in-}$ are applied to the amplifier while load devices M3 and M4 remain correctly biased for offset-cancellation by the voltages stored on capacitors $C_3$, $C_4$, $C_5$, and $C_p$. That is, the inventive circuit provides an AC path between a voltage corresponding to the average of $V_{out+}$ and $V_{out-}$ to the gate electrodes of load devices M3 and M4 separately via nodes 32 and 34 respectively. In this manner, a common-mode signal corresponding to the average of $V_{out+}$ and $V_{out-}$ is provided, and the gain of the differential amplifier is not significantly reduced.

If a common-mode disturbance should appear at input terminals 28 and 30, that would change the common-mode value (i.e. the average value) causing a similar change at nodes 24 and 26. Since the circuit is configured to provide negative feedback, an increase at $V_{out+}$ and $V_{out-}$ will cause an increase in voltage at nodes 24 and 26 reducing the drain currents of load devices of M3 and M4 which in turn drives the average value of $V_{out+}$ and $V_{out-}$ downward. Similarly, a decrease in $V_{out+}$ and $v_{out-}$, will cause a decrease in the voltage at nodes 24 and 26 resulting in an increase in the drain currents of load devices M3 and M4 causing the average value of $V_{out+}$ and $V_{out-}$ to increase.

Figure 4:
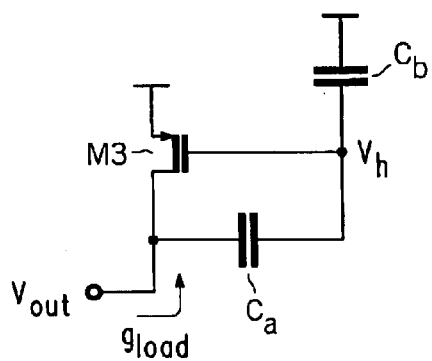
FIG. 4 is a schematic diagram of a single-ended half-circuit equivalent of the preamplifier load network shown in FIG. 3.

The differential and common-mode gains of the circuit shown in FIG. 3 can be analyzed by examining the single-ended half-circuit equivalent of the preamplifier load network shown in FIG. 4. Capacitors $C_a$ and $C_b$ take on different values for the differential and common-mode cases. It can be shown that the load conductance of the circuit shown in FIG. 4 is represented by the equation $$g_{load} = \frac{C_a}{C_a + C_b} g_m + g_{ds} \quad (1)$$

where $g_m$ and $g_{ds}$ are respectively the transconductance and output conductance of load device M3. Typically, for CMOS field-effect devices, $g_m$ is much greater than $g_{ds}$. In the common-mode case, $C_a$ is greater than $C_b$ so that the load conductance will be large, and the circuit will respond less to common-mode signals. In the differential case, $C_a$ should be much less than $C_b$ so that the load conductance will be small, and the circuit will have large differential gain. In the common-mode case, after setting $V_{out+}$ equal to $V_{out-}$ and the voltage at node 24 in FIG. 3 equal to the voltage at node 26, an analysis of the circuit shown in FIG. 4 yields the following values for $C_a$ and $C_b$:

$$C_a = C_4 + C_5$$
$$C_b = C_p \quad (2)$$

where $C_p$ is the parasitic capacitance. As a result, the circuit can be designed such that $C_a$ is greater than $C_b$ and therefore possesses good common-mode stability.

In the differential case, $V_{out+}$ equals minus $V_{out-}$, and the voltage at node 24 is equal to the negative of the voltage at node 26. In this case $$C_a = C_4 - C_5$$
$$C_b = 2C_5 + 2C_3 + C_p \quad (3)$$

thus, $C_a$ is much less than $C_b$ if $C_4$ is approximately equal to $C_5$ thereby providing for high differential gain.

The inventive differential amplifier can be designed to have high speed-power efficiency. $C_4$ and $C_5$ can be made to be quite small resulting in only a small degradation in common-mode stability. In an offset-cancelled amplifier, relatively large capacitors are required to minimize inaccuracies caused by charge injection mismatch from the switches. Capacitor $C_3$ can be made large to address this issue without reducing the speed of the circuit.

The differential gain of the inventive circuit can be modified by adjusting the relative sizes of capacitors $C_2$ and $C_5$. High differential gain requires low output conductance.

Using equations 1 and 3 above, the output conductance of the preamplifier is found to be $$g_{load} = \frac{C_4 - C_5}{C_4 + C_5 + C_3 + C_p} g_{m3} + g_{ds3} + g_{ds1} \quad (4)$$

where $g_{ds3}$ and $g_{ds1}$ are the drain-to-source conductances of load devices M3 and M1 respectively in FIG. 3. Since $g_{m3}$ is much greater than $g_{ds3}$, setting $C_4$ equal to $C_5$ will have the desirable effect of eliminating the first term of equation 4. However, if $C_5$ is made to be slightly larger than $C_4$, the first term of equation 4 can partially or completely cancel the other terms, resulting in a very low output conductance and a very large gain. Sizing $C_5$ for complete cancellation would theoretically result in infinite DC gain, but this situation cannot be achieved in practice due to process and temperature variations. Some increase in gain can be achieved by carefully sizing $C_5$ relative to $C_4$. If $C_5$ is large enough to result in a $g_{load}$ that is less than zero, then the circuit will operate as a latch. If a smaller preamplifier gain is desired, $C_5$ can be adjusted to be lower.

Thus, there has been provided a high speed, accurate, low power, and stable comparator preamplifier which may be used in a variety of data converter applications. Thus, while the invention has been described with reference to a specific embodiment, it should be appreciated that various modifications and changes can be made without departing from the scope of the invention as set forth in the appended claims. For example, n-channel devices may be replaced by p-channel devices, and p-channel devices replaced by n-channel devices with a corresponding reversal in supply voltages. Accordingly, the specifications and figures should be regarded as illustrative rather than restrictive, and all such modifications are intended to be included within the scope of the present invention.

What is claimed is:

1. An offset-compensated differential amplifier, comprising:
   a differential input stage comprising first and second input devices, said input stage having first and second input electrodes and first and second output terminals;
   a differential load stage comprising first and second load devices having first and second control electrodes respectively, said load stage coupled to said differential input stage and to said first and second output terminals; and
   first and second biasing circuits coupled to said first and second output terminals and coupled respectively to said first and second control electrodes for separately driving said first and second load devices to provide offset-voltage compensation.

2. A differential amplifier according to claim 1 wherein the first biasing circuit comprises:
   a first capacitor having a first terminal coupled to said first output terminal and having a second terminal; and
   a second capacitor having a first terminal coupled to said second output terminal and having a second terminal coupled to the second terminal of said first capacitor and to said first control electrode.

3. A differential amplifier according to claim 2 wherein the second biasing circuit comprises:
   a third capacitor having a first terminal coupled to said first output terminal and having a second terminal; and
   a fourth capacitor having a first terminal coupled to said second output terminal and having a second terminal coupled to the second terminal of said third capacitor and to said second control electrode.

4. A differential amplifier according to claim 3 further comprising a third capacitor coupled between said first and second control electrodes.

5. A differential amplifier according to claim 3 wherein said first capacitor has a capacitance substantially equal to that of said fourth capacitor.

6. A differential amplifier according to claim 5 wherein said second capacitor has a capacitance substantially equal to that of said third capacitor.

7. A differential amplifier according to claim 6 further comprising first and second switches coupled to said first and second input electrodes and configured to apply an input signal to said first and second input electrodes when said first and second switches are in a first state.

8. A differential amplifier according to claim 7 further comprising third and fourth switches coupled to said first and second input electrodes and configured to couple said first and second input electrodes to a common voltage when said third and fourth switches are in said first state.

9. A differential amplifier according to claim 8 further comprising fifth and sixth switches, said fifth switch coupled between said first control electrode and said first output terminal and said sixth switch coupled between said second control electrode and said second output terminal.

10. A differential amplifier according to claim 9 wherein said first and second input devises are MOS transistors of the same channel type.

11. A differential amplifier according to claim 10 wherein said first and second load devices are MOS transistors of the same channel type.

12. A differential amplifier according to claim 11 wherein said first and second input devices are n-channel field-effect-transistors and said first and second load devices are p-channel field-effect-transistors.

13. A differential amplifier according to claim 8 wherein a biasing voltage is stored across said first and second capacitors and across said third and fourth capacitors when said third and fourth switches are in said first state.

14. A differential amplifier according to claim 13 wherein said biasing voltage is the average of the voltages at the first and second output terminals when the first and second switches are in said first state.

15. A differential amplifier according to claim 14 wherein said biasing voltage is applied to said first and second control electrodes when said first and second switches are in said first state to cancel input offset-voltage.

16. An offset-compensated differential amplifier, comprising:
a differential input stage comprising first and second input devices, said input stage having first and second input electrodes and first and second output terminals;
a differential load stage comprising first and second load devices having first and second control electrodes respectively, said load stage coupled to said differential input stage and to said first and second output terminals;
first and second capacitive networks coupled to said first and second output terminals and coupled respectively to said first and second control electrodes for separately driving said first and second load devices; and
a first capacitor coupled between said first and second control electrodes.

17. A differential amplifier according to claim 16 wherein said first capacitive network comprises:
a second capacitor having a first terminal coupled to said first output terminal and having a second terminal; and
a third capacitor having a first terminal coupled to said second output terminal and having a second terminal coupled to the second terminal of said second capacitor and to said first control electrode.

18. A differential amplifier according to claim 17 wherein said second capacitive network comprises:
a fourth capacitor having a first terminal coupled to said first output terminal and having a second terminal; and
a fifth capacitor having a first terminal coupled to said second output terminal and having a second terminal coupled to the second terminal of said fourth capacitor and to said second control electrode.

19. A differential amplifier according to claim 18 wherein said second capacitor has a capacitance substantially equal to that of said fifth capacitor and said third capacitor has a capacitance substantially equal to that of said fourth capacitor.

20. A differential amplifier according to claim 19 further comprising:
first and second switches coupled to said first and second input terminals and configured to apply an input signal to said first and second input electrodes when said first and second switches are in a first state; and
third and fourth switches coupled to said first and second input electrodes and configured to couple said first and second input electrodes to a common voltage when said third and fourth switches are in said first state.

21. A differential amplifier according to claim 20 further comprising fifth and sixth switches, said fifth switch coupled between said first control electrode and said first output terminal and said sixth switch coupled between said second control electrode and said second output terminal.

22. A differential amplifier according to claim 21 wherein a biasing voltage is stored across said second and third capacitors and across said fourth and fifth capacitors when said third and fourth switches are in said first state.

23. A differential amplifier according to claim 22 wherein said biasing voltage is the average of the voltages at the first and second output terminals when the first and second switches are in said first state and wherein said biasing voltage is applied to said first and second control electrodes when said first and second switches are in said first state to cancel input offset-voltage.

24. An offset-compensated differential amplifier, comprising:
a differential input stage comprising first and second input devices, said input stage having first and second input electrodes and first and second output terminals;
a differential load stage comprising first and second load devices having first and second control electrodes respectively, said load stage coupled to said differential input stage and to said first and second output terminals;
a first capacitor coupled between said first and second control electrodes; and
an offset compensation circuit coupled to said first and second output terminals and coupled respectively to said first and second control electrodes for providing separate compensation biasing signals to said first and second control electrodes.

25. A differential amplifier according to claim 24 wherein said offset-cancellation circuit comprises first and second capacitive networks coupled to said first and second output terminals and coupled respectively to said first and second control electrodes for separately driving said first and second load devices.

26. A differential amplifier according to claim 25 wherein said first capacitive network comprises a second capacitor having a first terminal coupled to said first output terminal and having a second terminal, and a third capacitor having a first terminal coupled to said second output terminal and having a second terminal coupled to the second terminal of said second capacitor and to said first control electrode, and wherein said second capacitive network comprises a fourth capacitor having a first terminal coupled to said first output terminal and having a second terminal, and a fifth capacitor having a first terminal coupled to said second output terminal and having a second terminal coupled to the second terminal of the said fourth capacitor and to said second control electrode.

27. A differential amplifier according to claim 26 wherein said second capacitor has a capacitance substantially equal to that of said fifth capacitor and wherein said third capacitor has a capacitance substantially equal to that of said fourth capacitor.

28. A differential amplifier according to claim 27 further comprising:

first and second switches coupled to said first and second input electrodes and configured to apply an input signal to said first and second input electrodes when said first and second switches are in a first state; and third and fourth switches coupled to said first and second input electrodes and configured to couple said first and second electrodes to a common voltage when said third and fourth switches are in said first state.

29. A differential amplifier according to claim 28 wherein said biasing voltage is the average of the voltages at the first and second output terminals when the first and second switches are in said first state and wherein said biasing voltage is applied to said first and second control electrodes when said first and second switches are in said first state to compensate for input offset-voltage.

30. A method for compensating for input offset-voltage in a differential amplifier of the type which comprises a differential input stage including first and second input devices, a differential load stage comprising first and second load devices each having a control electrode, and first and second output terminals, the method comprising:

coupling said first and second input devices to a common voltage;

storing a voltage representative of the resultant input offset-voltage;

coupling said differential input stage to a differential input signal; and separately applying offset-voltage compensation signals to said first and second control electrodes respectively.

31. A method according to claim 30 wherein the voltage representative of the resultant input offset-voltage is the average of the voltage appearing at the first and second output terminals.

32. A method according to claim 31 wherein the voltage representative of the resultant input offset-voltage is stored in first and second capacitive networks coupled to the first and second control electrodes respectively.

* * * * *